(12) United States Patent
Anderson et al.

(10) Patent No.: US 7,629,742 B2
(45) Date of Patent: Dec. 8, 2009

(54) ELECTROLUMINESCENT DISPLAYS, MEDIA, AND MEMBERS, AND METHODS ASSOCIATED THEREWITH

(75) Inventors: Frank Edward Anderson, Sadieville, KY (US); Timothy Lowell Strunk, Georgetwon, KY (US)

(73) Assignee: Lexmark International, Inc., Lexington, KY (US)

( * ) Notice: Subject to any disclaimer, the term of this patent is extended or adjusted under 35 U.S.C. 154(b) by 499 days.

(21) Appl. No.: 11/378,980

(22) Filed: Mar. 17, 2006

(65) Prior Publication Data
US 2007/0216301 A1   Sep. 20, 2007

(51) Int. Cl.
*H01J 1/62* (2006.01)
(52) U.S. Cl. .................................. 313/506; 313/512
(58) Field of Classification Search ................ 313/484, 313/491, 498, 503, 506, 509, 512
See application file for complete search history.

(56) References Cited

U.S. PATENT DOCUMENTS

| | | | |
|---|---|---|---|
| 2,755,406 A | 7/1956 | Burns | |
| 3,299,307 A | 1/1967 | Inoue | |
| 5,164,225 A | 11/1992 | Nire et al. | |
| 5,485,145 A | 1/1996 | Sniff | |
| 5,902,688 A | 5/1999 | Antoniadis et al. | |
| 6,369,506 B1 | 4/2002 | Hata | |
| 6,451,460 B1 | 9/2002 | Sun et al. | |
| 6,566,808 B1 | 5/2003 | Duggal et al. | |
| 6,650,044 B1 | 11/2003 | Lowery | |
| 6,758,538 B2 | 7/2004 | Fujita et al. | |
| 6,787,990 B2 | 9/2004 | Cok | |
| 6,833,202 B2 | 12/2004 | Lee et al. | |
| 2002/0090495 A1 | 7/2002 | Bezenek et al. | |
| 2003/0214475 A1 | 11/2003 | Izumi et al. | |
| 2004/0093778 A1 | 5/2004 | Asvadi | |
| 2004/0119404 A1* | 6/2004 | Kato et al. | 313/506 |
| 2005/0140281 A1 | 6/2005 | Park | |
| 2005/0162076 A1 | 7/2005 | Kato | |

OTHER PUBLICATIONS

"Inorganic EL Displays at the Crossroads," Heikenfeld and Steckl, *Information Display*, Dec. 2003.
"Joint Development of Ultra-Bright, Inorganic EL Light-Emitting Materials," Kuraray Co., Ltd, Nov. 2, 2005.

* cited by examiner

*Primary Examiner*—Vip Patel
(74) *Attorney, Agent, or Firm*—Neill R. Kahle, Jr.

(57) ABSTRACT

Electroluminescent (EL) displays, media, and members, and methods associated therewith. One such display includes an EL material, conductor layers, and a reflective image formed by a pattern of imaging substance applied adjacent at least one of the conductor layers. The EL material is between at least two of the conductor layers, and at least one of the conductor layers is applied adjacent the EL material in a pattern to form a conductive image. Upon application of an operational potential to the at least two of the conductor layers having the EL material therebetween, the display can be illuminated in an area corresponding to the conductive image.

11 Claims, 6 Drawing Sheets

ELECTROLUMINESCENT DISPLAYS, MEDIA, AND MEMBERS, AND METHODS ASSOCIATED THEREWITH

FIELD OF THE DISCLOSURE

The disclosure is directed to electroluminescent (EL) displays and methods to produce such displays. In particular, in one embodiment, the disclosure is directed to EL displays fabricated using micro-fluid ejection methods.

BACKGROUND AND SUMMARY

A variety of displays are used to attract the attention of consumers. Illumination of these displays is often provided by incandescent or fluorescent lighting systems which are expensive to construct and operate.

In order to provide lower cost illumination of displays (which, as used herein, also includes signs, billboards, other types of signage and the like), newer, lower cost illumination devices may be used. For example, one type of display device in use today uses electroluminescence (EL) technology to emit light, thereby featuring an image. Illumination of the display device is accomplished by placing alternating electric fields across a layer of electroluminescent material that is sandwiched between a transparent conductor layer and a second conductor layer usually with an intervening dielectric to prevent voltage breakdown.

A translucent substrate containing an image printable layer may be applied to an electroluminescent substrate containing the electroluminescent material and an image may be printed on the image printable layer. Upon activation of the electroluminescent material, the image is illuminated. Construction of one such electroluminescent media is described for example in U.S. Publication No. 2002/0090495, the disclosure of which is incorporated herein by reference.

Conventional electroluminescent displays are typically highly customized. Hence, everything from the display device to any related driving electronics is unique to a particular end use of the display. Thus, the user's ability to implement changes to the display is limited and changes or alterations of the display may be extremely costly.

Another disadvantage of conventional electroluminescent displays is that such displays usually require illumination of the entire electroluminescent media at one time. Accordingly, it is difficult to provide displays with selective illumination or displays having the appearance of motion. Accordingly, there remains a need for improved electroluminescent display systems.

With regard to the foregoing needs, an exemplary embodiment of the disclosure provides a display including an electroluminescent (EL) material, conductor layers, and a reflective image formed by a pattern of imaging substance applied adjacent at least one of the conductor layers. The EL material is between at least two of the conductor layers, and at least one of the conductor layers is applied adjacent the EL material in a pattern to form a conductive image. Upon application of an operational potential to the at least two of the conductor layers having the EL material therebetween, the display can be illuminated in an area corresponding to the conductive image.

Another exemplary embodiment of the disclosure provides a method for making a display comprising an electroluminescent (EL) material and conductor layers, wherein the EL material is between at least two of the conductor layers. The method involves applying imaging substance in a pattern adjacent at least one of the conductor layers to form a reflective image. At least one of the conductor layers is applied adjacent the EL material in a pattern to form a conductive image. Upon application of an operational potential to the at least two of the conductor layers having the EL material therebetween, the display can be illuminated in an area corresponding to the conductive image.

An advantage of at least some of the foregoing embodiments is that customized displays using EL materials may be made at a customer's site using relatively inexpensive imaging apparatus, such as printers. Since designs may be created quickly on a computer and printed with relative ease on a second substrate such as paper, such displays may be fabricated quickly and at less cost than with slower depositing techniques that require blanket EL layers. Hence, the embodiments described herein may provide displays and signage that enable a wider range of design features and improved interchangeability of the displays.

BRIEF DESCRIPTION OF THE DRAWINGS

Further advantages of the exemplary embodiments may become apparent by reference to the detailed description when considered in conjunction with the elements through the several views, and wherein.

DETAILED DESCRIPTION OF EXEMPLARY EMBODIMENTS

Figure 1A:
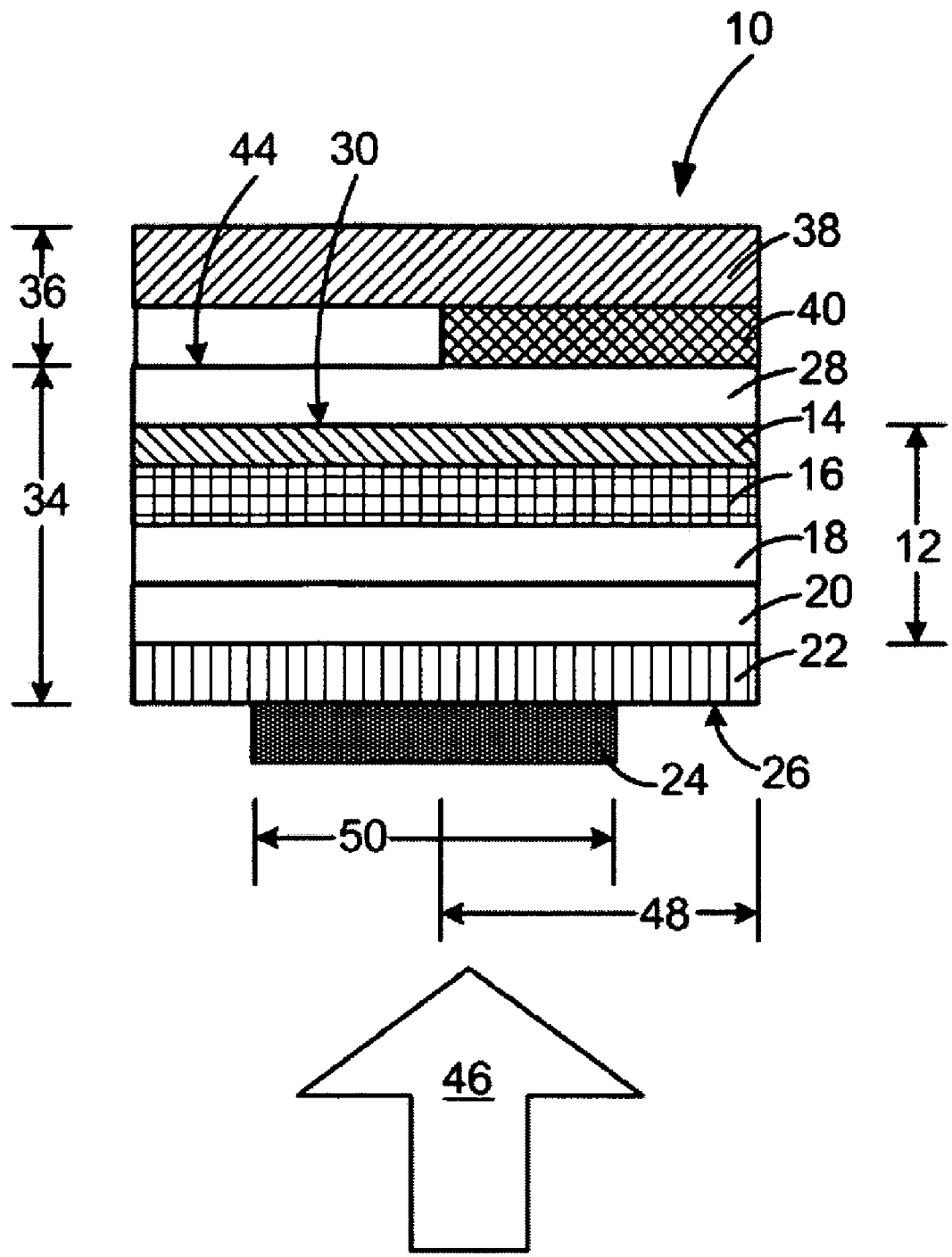
FIG. 1A is a cross-sectional view, not to scale, of an electroluminescent (EL) display according to the disclosure.

As described in more detail below, embodiments of the disclosure provide a system and method for providing improved EL displays. A pattern(s) may be printed on an EL substrate to provide, for example, a customized display that is attachable to a second substrate. Conductive material may be printed in a pattern(s) on a second substrate to form a conductive image. The second substrate may be attached to the EL substrate, thereby creating an EL display that may be selectively illuminated by the introduction of an electric current to the pattern of conductive material.

With reference to FIG. 1, there is provided a cross-sectional view, not to scale, of a display 10 including a substrate 12. In this embodiment, the substrate 12 is an EL substrate. Current commercially available EL substrates 12 typically include an insulative or dielectric layer 14, an EL material layer 16, a translucent conductor layer 18, and a translucent protective layer 20. It is conceivable that EL substrates 12 could reduce the number of these layers by incorporating some or all of these functions in the EL material itself, for example. Furthermore, some applications may not require one or more of these layers. For example, in some disposable applications, the protective layer 20 may not be needed.

Although it may not be necessary for some current or future printing techniques and/or EL substrates, an image receiving layer 22 may be applied to the translucent protective layer 20 to provide a suitable surface for receiving a reflective image 24. The image 24 can be printed on to a first surface 26 of the image receiving layer 22. An adhesion layer 28 can be applied to a second surface 30 of layer 14. A plan view of the display 10 with an image 24 is shown in FIG. 1B.

Figure 2:
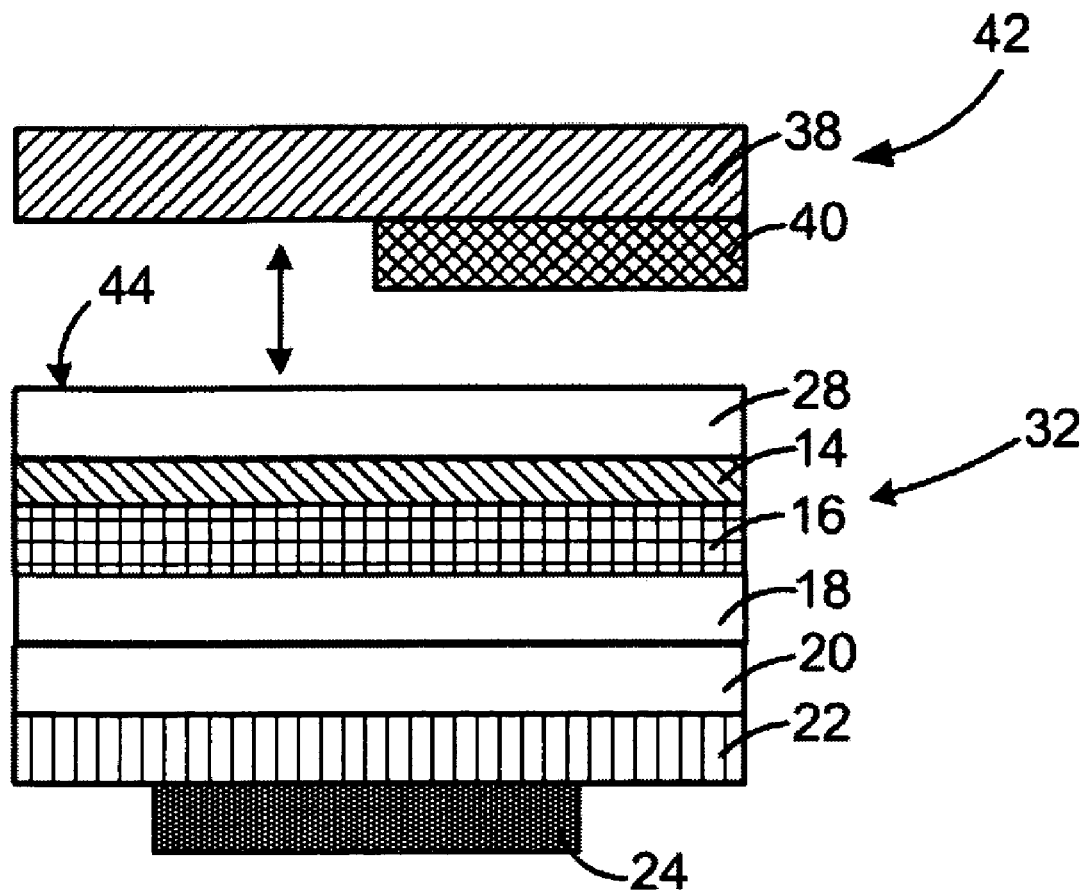
FIG. 2 is a cross-sectional view, not to scale, of a first member (including an electroluminescent (EL) substrate, an adhesion layer, a translucent image receiving layer, and an image) and a second member (including a second substrate and an electrode layer) according to the disclosure.

Layers 14, 16, 18, 20, 22, and 28 comprise a first medium 34 on which the image 24 is applied to form a first member 32 (shown separately in FIG. 2). The image 24 may be provided by a pattern of applied imaging substance such as, for example, monochrome or color inks. Such a substance may be applied to the image receiving layer 22 using, for example, screen printing, rotogravure printing, flexographic printing, lithographic printing, laser printing, ink jet printing, and the like. More flexibility in applying an image to the image receiving layer 22 may be provided by ink jet printing as described in U.S. Publication No. 2002/0090495.

The first medium 34 has an overall thickness ranging from about 0.1 to about 0.6 millimeters. The insulative or dielectric layer 14 typically has a thickness ranging from about 20 to about 200 micrometers, and may be provided by a material selected from tantalum oxide, aluminum oxide, alumina, aluminosilicates, borosilicate glass, an alkali metal aluminosilicate hydrate, polyester films, polyimide films, polyamide films, polycarbonate films, poly(phenylene oxide films, poly (phenylene sulfide) films, poly(vinyl chloride) films, poly (chlorotrifluoroethylene) films, poly(p-phenyleneethylene) films, polystyrene films, polyethylene films, polypropylene films, poly(tetrafluoroethylene) films, and the like. A particularly suitable layer 14 might comprise a fluoropolymer material, such as a poly(tetrafluoretheylene), loaded with an alkaline earth metal titanate (or, e.g., barium titanate or strontium titanate).

The EL layer 16 may include organic and/or inorganic EL materials. Inorganic materials typically provide brighter luminous characteristics and may be selected from terbium-doped zinc sulfide (ZnS:Tb), manganese-doped zinc sulfide (ZnS:Mn), cerium-doped yttrium aluminum garnet (YAG:Ce), copper-doped zinc selenium sulfide (ZnSeS:Cu), europium-doped strontium barium silicon oxide (SrBaSiO4:Eu), cerium-doped strontium sulfide (SrS:Ce), copper-doped strontium sulfide (SrS:Cu), copper and silver-doped strontium sulfide (SrS:Cu,Ag), and the like. The thickness of the EL layer 16 may range from about 100 nanometers to about 5 microns.

The conductor layer 18 of the EL substrate 12 is typically made of a translucent conductive material such as indium tin oxide (ITO), zinc oxide, aluminum- or boron-doped zinc oxide, cadmium sulfide, cadmium oxide, tin oxide, and Fluorine-doped tin oxide. The conductor layer 18 typically has a thickness ranging from about 50 to about 10,000 Angstroms.

A protective transparent or translucent protective layer 20 is applied to the translucent conductor layer 18. The translucent protective layer 20 may be selected from polyethylene terephthalate, polybutylene >terephthalate, polycarbonate, and the like. The thickness of the protective layer 20 may range from about 20 to about 150 micrometers).

The EL substrate 12 is relatively thin and ideally flexible so that it can be easily handled in an imaging apparatus, such as an ink jet printer. Overall, the thickness of the EL substrate 12 ranges from about 0.1 to about 0.5 millimeters EL substrates 12 as described above are commercially available from BKL, Inc. of King of Prussia, Pa., Luminescent Systems, Inc. of Lebanon, N.H., and Edmund Optics, Inc. of Barrington, N.J.

As previously mentioned, an image receiving layer 22, such as an ink receptive layer, can be applied adjacent (e.g., to) the protective layer 20 of the EL substrate 12. The image receiving layer 22 may be provided by a wide variety of micro-porous organic or inorganic materials that are, for example, compatible with the ink applied to form the image 24. One such image receiving layer 22 is a layer of fumed silica in a binder. The thickness of the image receiving layer 22 may range from about 1 to about 40 micrometers.

The image receiving layer 22 may be applied to the protective layer 20 by a wide variety of coating techniques, including but not limited to, roll coating, doctor blade coating, spray coating, dipping, screen coating, and the like. However, in order to minimize the cost of the EL display 10, the image receiving layer 22 may be applied by a micro-fluid ejection device in the same pattern as the image 24, since the image 24 may not be applied to the entire area of the EL substrate 12 as shown in FIG. 1B.

A second medium 36 is provided, such as one comprising a second substrate 38. Another conductor layer, such as electrode layer 40, may be applied in a pattern to form a conductive image on the second substrate 38 by a wide variety of printing techniques including, but not limited to, screen printing, rotogravure printing, flexographic printing, lithographic printing, and ink jet printing. The electrode layer 40 may also be, for example, a single conductive layer (e.g., where conductor layer 18 is applied adjacent the EL material layer in a pattern). Conductive inks that may be used to provide the electrode layer 40, include, but are not limited to inks containing copper, silver, or carbon particles. In order to provide increased flexibility for design and operation of the EL display 10, a conductive ink may be applied by a micro-fluid ejection device to provide the selective conductor pattern for the electrode layer 40: In an alternative embodiment, the electrode layer 40 might be applied directly onto surface 30 of EL substrate 12 (adhesion layer 28 therefore being unnecessary).

The thickness of the electrode layer 40 may range from about 0.5 to about 5 micrometers. The second medium 36 having an electrode layer 40 formed thereon may be viewed as constituting a second member 42, shown separated from first member 32 in FIG. 2. With reference back to FIG. 1, the second member 42 can be attached to the first member 32 adjacent a third surface 44 of the adhesion layer 28 to form the EL display 10.

The second substrate 38 for supporting the electrode layer 40 can be made of paper ranging in thickness from about 0.5 to about 2 mils (or about 15 to about 50 micrometers). The second substrate 38 may, however, consist of other materials such as coated paper, PET, polycarbonate films, polyamide films, polystyrene films, polypropylene films, and the like.

The EL display 10 will illuminate in areas 48 where the electrode layer 40 has been deposited (corresponding to the conductive image) when an operational potential is applied between conductor layer 18 and the electrode layer 40. The electrode layer 40 may be further subdivided into more than one sublayer such as a conductor layer, contact pads, and a trace layer connecting the conductor layer to the contact pads, or may constitute a single layer including any necessary electrical traces and contact pads.

A viewer, looking at the EL display 10 (FIG. 1) in the direction of arrow 46, may see illuminated areas (designated one-dimensionally by block 48) corresponding to areas where the electrode layer 40 has been applied to the second substrate 38. A viewer, looking at the EL display apparatus 10 in the direction of arrow 46, may also see reflective image areas (designated one-dimensionally by block 50) corresponding to areas where the image 24 was applied to the image receiving layer 22. The illuminated areas 48 and the reflective image areas 50 may or may not overlap with one another.

Figure 3:
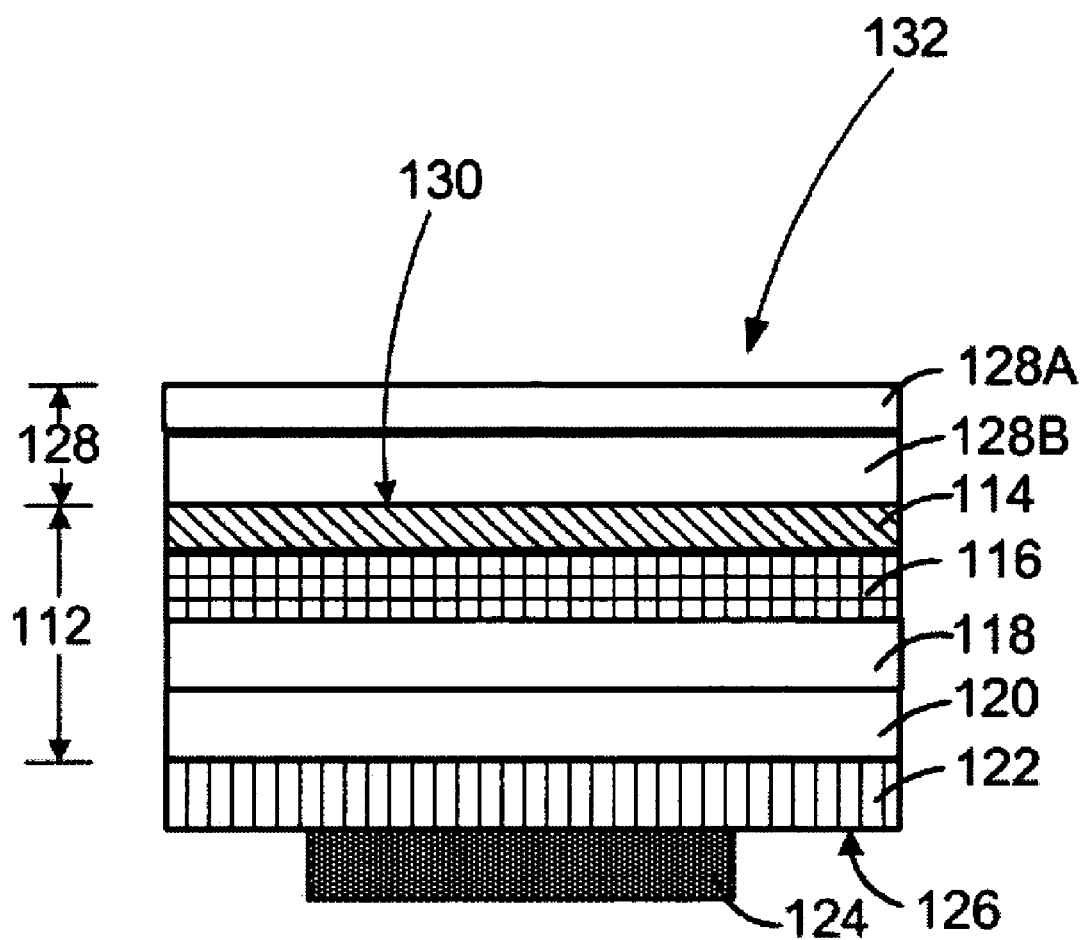
FIG. 3 is a cross-sectional view, not to scale, of a first member of an electroluminescent (EL) display according to the disclosure.

One embodiment of the present invention shown in FIG. 3 includes an electroluminescent (EL) display first member 132. The first member 132 includes an EL substrate 112. As mentioned in the previous embodiment with reference to EL substrate 12 in FIG. 1, the EL substrate 112 shown in FIG. 3 typically includes an insulative or dielectric layer 114, an EL material layer 116, a translucent conductor layer 118, and a translucent protective layer 120. An image receiving layer 122 may be applied to the translucent protective layer 120 to provide a suitable surface for receiving an image 124. The image 124 may be printed onto a first surface 126 of the image receiving layer 122. An adhesion layer 128 can be applied to a second surface 130 of the insulative layer 114.

In this embodiment, the adhesion layer 128 includes at least two sub-layers including a removable liner layer 128A and an adhesive layer 128B. The adhesive layer 128B has a thickness ranging from about 7 to about 75 micrometers, and should remain substantially attached to the second surface 130 of the insulative layer 114 if and when the removable liner layer 128A is removed. The adhesive layer 128B can be used to attach the first member 132 to an electrical conductive member such as one formed on a second medium (e.g., medium 36 shown in FIG. 1A or medium 236 shown in FIG. 5). The identity of and physical properties of the materials that make up the first member 132 can be similar to those described above with reference to the first member 32 as shown in FIG. 2. Therefore, the properties and characteristics of first member 132 will not be repeated here.

Figure 4:
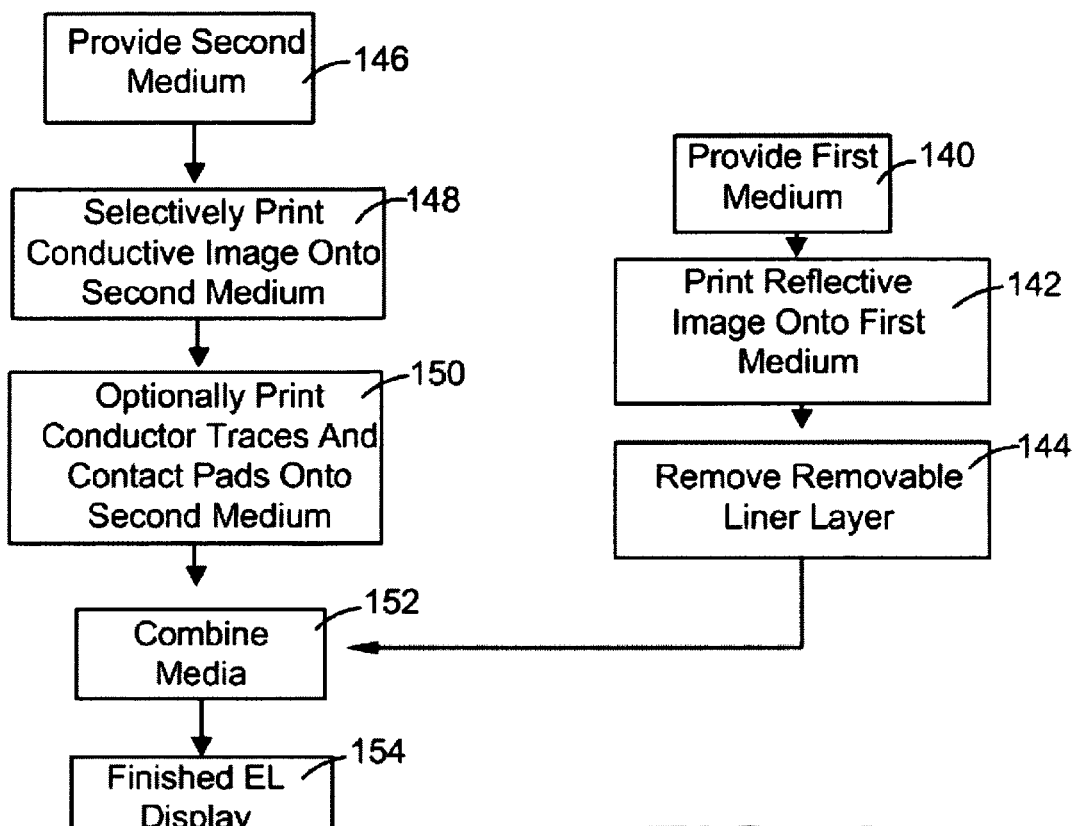
FIG. 4 is a flow diagram depicting the steps of a method to fabricate an EL display according to the disclosure.
Figure 5:
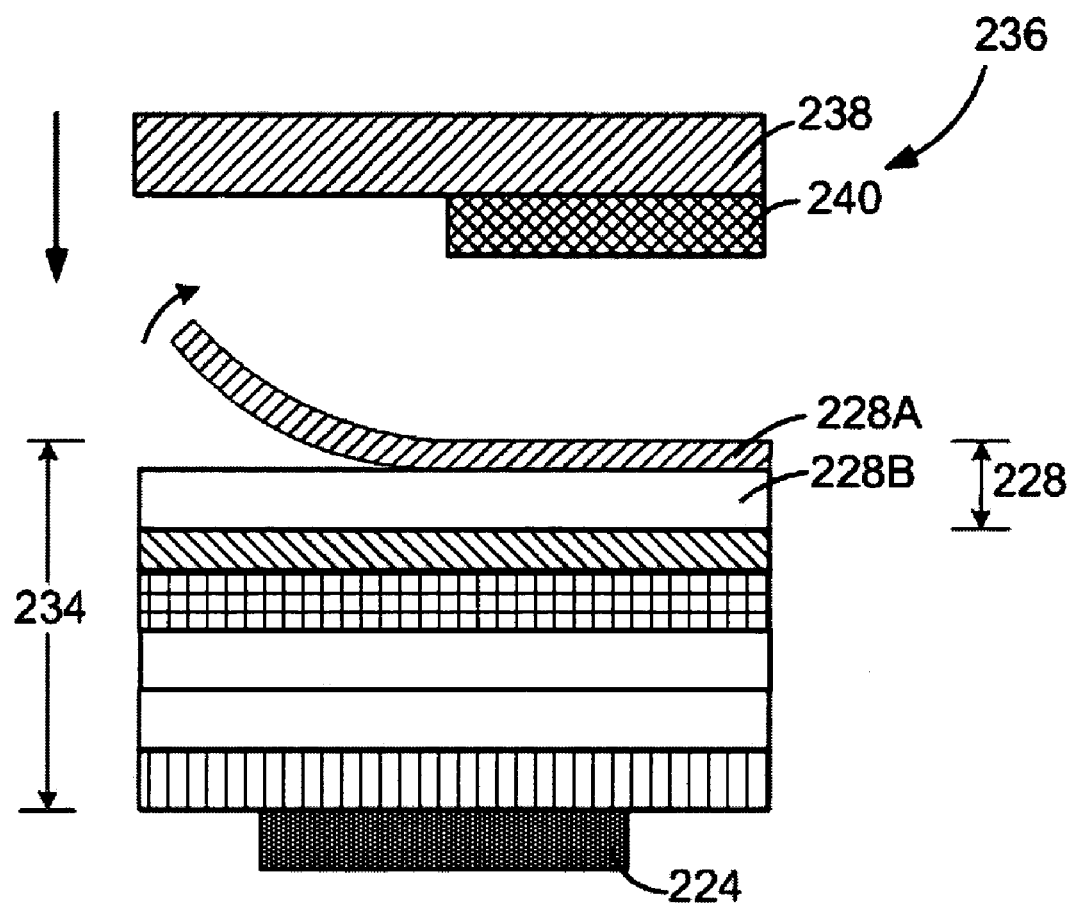
FIG. 5 is a cross-sectional view, not to scale, of a first member (including an electroluminescent (EL) substrate, a removable liner layer, an adhesive layer, a translucent image receiving layer, and an image) and a second member (including a second substrate and an electrode layer) according to the disclosure.

Yet another embodiment of the invention includes a method to fabricate an is EL display such as EL display 10. FIG. 4 provides a flow chart summarizing the steps of one method described herein. FIG. 5 illustrates fabrication of an EL display according to the flow chart provided in FIG. 4 and the following description. The first step 140 in FIG. 4 includes providing a first medium 234, such as one similar to the first medium 34 described above. As shown in step 142, a reflective image 224, such as one similar to image 24 described above, can be printed onto the first medium 234, such as through the use of micro-fluid ejection printing technology. Step 144 of the process includes removing a removable liner layer 228A, such as one similar to removable liner layer 128A discussed above. If a removable liner is not present, step 144 may be skipped.

Figure 1B:
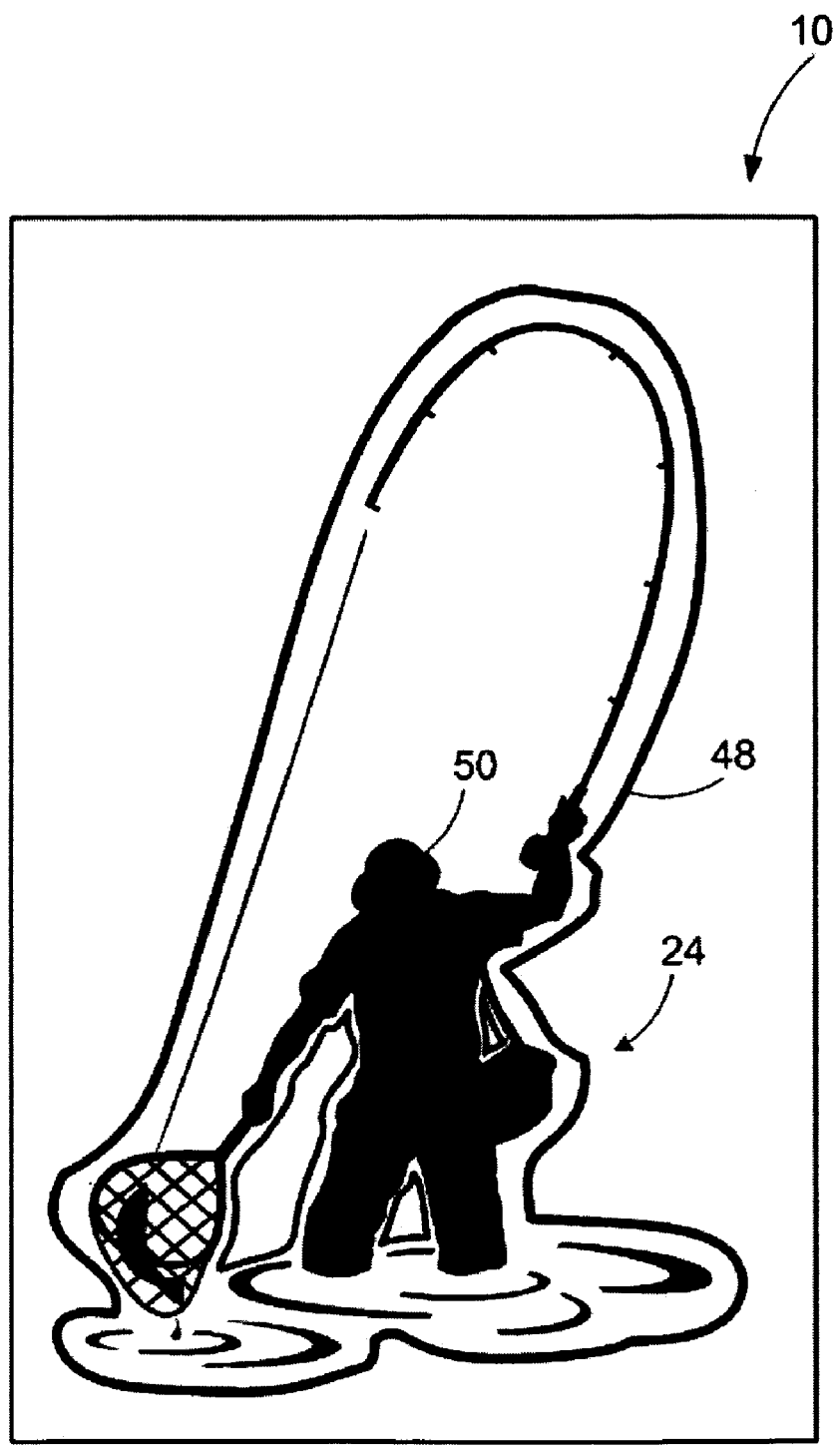
FIG. 1B is a plan view, not to scale, of an electroluminescent (EL) display according to the disclosure.

Step 146 includes providing a second medium 236, such as one similar to second medium 36 shown in FIG. 1A. At least one conductor layer 240 is then printed onto the second medium 236 as shown in step 148. As discussed in previous embodiments, the conductor layer 240 may be further subdivided into more than one sublayer, such as a conductor layer, contact pads, and a trace layer connecting the conductor layer to the contact pads, or may constitute a single layer including any necessary electrical traces and contact pads. If the conductor layer 240 is further subdivided into more than one layer, additional printing steps such as step 150 may be necessary to apply the additional layer or layers. As shown in step 152, the first medium 234 and the second medium 236 may be combined (e.g., attached to one another, as by an adhesion layer 228 similar to adhesion layer 28 (FIG. 1A) or adhesive layer 128B (FIG. 3)). It should be understood that the first set of steps (steps 140, 142, and 144) and the second set of steps (146, 148, and 150) may occur simultaneously or in different orders.

Having described various aspects and embodiments herein and several advantages thereof, it will be recognized by those of ordinary skill that the disclosed embodiments are susceptible to various modifications, substitutions and revisions within the spirit and scope of the appended claims.

What is claimed is:

1. An electroluminescent (EL) display comprising:
   a. EL material;
   b. conductor layers, wherein the EL material is between at least two of the conductor layers, at least one of the conductor layers having been applied adjacent the EL material in a pattern to form a conductive image by a conductive ink; and
   c. an image receiving layer applied adjacent to at least one of the conductor layers, wherein a reflective image is formed on a surface of the image receiving layer by a pattern of imaging substance applied adjacent at least one of the conductor layers, and
   wherein the conductor layers includes contact pads having electrical communication with the conductive ink that forms the conductive image, and upon application of an operational potential to the at least two of the conductor layers having the EL material therebetween, the display is configured to selectively illuminate an area corresponding to the conductive image.

2. The display of claim 1 wherein the imaging substance was applied by a micro-fluid ejection device.

3. The display of claim 1 wherein a conductor layer that forms the conductive image was applied by a micro-fluid ejection device.

4. The display of claim 1 wherein the conductive image was formed on a substrate comprising paper and adhered adjacent the EL material by an adhesion layer adjacent a side of the EL material.

5. The display of claim 1 wherein at least one of the conductor layers comprise a translucent conductive layer.

6. The display of claim 1 wherein the imaging substance comprises an ink composition containing a conductive material selected from the group consisting of silver, carbon, and copper, and wherein the image receiving layer is translucent ink receiving layer adjacent at least one of the conductor layers for receiving the ink.

7. An electroluminescent display member that is attachable to a separate conductor member, the display member comprising:
   a. an electroluminescent (EL) substrate having an insulative layer on a first side thereof and a translucent protective layer on a second side thereof;
   b. an adhesion layer applied to the insulative layer;
   c. a translucent image receiving layer applied to the translucent protective layer, wherein an image is formed on a surface of the translucent image receiving layer; and
   d. conductor layers, wherein the electroluminescent (EL) substrate is between at least two of the conductor layers, at least one of the conductor layers form a conductive image by a conductive ink, and wherein the display is configured to selectively illuminate an area corresponding to the conductive image.

8. The electroluminescent display member of claim 7 wherein the adhesion layer further comprises a removable liner layer and an adhesive layer, wherein the adhesive layer is applied adjacent to the insulative layer.

9. The electroluminescent display member of claim 7 wherein the image on the image receiving layer was formed by a micro-fluid ejection device.

10. The electroluminescent display member of claim 7 wherein the EL substrate comprises a translucent conductive layer disposed between the translucent protective layer and an electroluminescent material layer.

11. The electroluminescent display member of claim 7 wherein the image is formed by an ink composition containing a conductive material selected from the group consisting of silver, carbon, and copper.

* * * * *